US009304367B2

United States Patent
Wu et al.

(10) Patent No.: US 9,304,367 B2
(45) Date of Patent: Apr. 5, 2016

(54) ELECTRO-STATIC DISCHARGE PROTECTION CIRCUIT AND LIQUID CRYSTAL DISPLAY

(71) Applicants: Xiamen Tianma Micro-Electronics Co., Ltd., Xiamen (CN); Tianma Micro-Electronics Co., Ltd., Shenzhen (CN)

(72) Inventors: Hao Wu, Xiamen (CN); Jun Xia, Xiamen (CN)

(73) Assignees: Xiamen Tianma Micro-Electronics Co., Ltd., Xiamen (CN); Tianma Micro-Electronics Co., Ltd., Shenzhen (CN)

( * ) Notice: Subject to any disclaimer, the term of this patent is extended or adjusted under 35 U.S.C. 154(b) by 154 days.

(21) Appl. No.: 14/222,108

(22) Filed: Mar. 21, 2014

(65) Prior Publication Data
US 2015/0160522 A1    Jun. 11, 2015

(30) Foreign Application Priority Data
Dec. 11, 2013    (CN) .......................... 2013 1 0673670

(51) Int. Cl.
G02F 1/1333    (2006.01)
G02F 1/1362    (2006.01)
H01L 27/02    (2006.01)
H02H 9/04    (2006.01)

(52) U.S. Cl.
CPC ...... *G02F 1/136204* (2013.01); *H01L 27/0266* (2013.01); *H02H 9/045* (2013.01); *H02H 9/046* (2013.01)

(58) Field of Classification Search
CPC ...................... G02F 1/136204; H01L 27/0266
USPC ................. 349/40; 257/355; 361/56
See application file for complete search history.

(56) References Cited

U.S. PATENT DOCUMENTS

2006/0119757 A1* 6/2006 Tsao ................. G02F 1/136204
                                                                349/40
2009/0021872 A1    1/2009 Ker et al.
2012/0086081 A1    4/2012 Moriwaki

FOREIGN PATENT DOCUMENTS

DE    102010045325 A1    4/2011
WO    2004072941 A2    8/2004

* cited by examiner

*Primary Examiner* — Thanh-Nhan P Nguyen
(74) *Attorney, Agent, or Firm* — Alston & Bird LLP

(57) ABSTRACT

An electro-static discharge protection circuit for a liquid crystal display is disclosed. In response to positive electro-static charges being generated on the signal line, a thin film transistor with a gate electrode connected to the high level signal line is switched on, and the positive electro-static charges are discharged through the switched on thin film transistor. In addition, in response to negative electro-static charges being generated on the signal line, a thin film transistor with a gate electrode connected to the low level signal line is switched on, and the negative electro-static charges are discharged through the switched on thin film transistor.

20 Claims, 3 Drawing Sheets

US 9,304,367 B2

ELECTRO-STATIC DISCHARGE PROTECTION CIRCUIT AND LIQUID CRYSTAL DISPLAY

CROSS REFERENCE TO RELATED APPLICATIONS

This application claims the benefit of priority to Chinese Patent Application No. 201310673670.5, filed with the Chinese Patent Office on Dec. 11, 2013 and entitled "ELECTRO-STATIC DISCHARGE PROTECTION CIRCUIT AND LIQUID CRYSTAL DISPLAY", the content of which is incorporated herein by reference in its entirety.

TECHNICAL FIELD

The present invention relates to the field of liquid crystal display, and particularly to an electro-static discharge protection circuit and a liquid crystal display.

BACKGROUND OF THE INVENTION

In the manufacturing process of a Thin Film Transistor Liquid Crystal Display (TFT-LCD), Electro-Static Discharge (ESD) protection has always been an important research subject. Static electricity is a major factor only second to particle affecting the production rate. Whether the solution to the ESD problem is good or not may directly affect the enterprise benefits.

Electro-static discharge is a phenomenon of electrostatic charges transferring between different objects due to electro-static accumulation. Electro-static discharge occurs within a very short period, a large amount of current is generated within such a short period, and the large amount of current generally damages a semiconductor integrated circuit once flowing through the semiconductor integrated circuit to cause electro-static damage. The electro-static damage is a common phenomenon and may lead to breakdown of an insulating medium so as to cause threshold voltage shift or short circuit between a gate electrode and source and drain electrodes. For a thin film transistor device such as a TFT-LCD, the electro-static damage is more liable to occur in the manufacturing process because a thin film transistor (TFT) is formed on an insulating substrate glass and electrode charges are easily accumulated to a higher voltage level. When the electro-static accumulation reaches a certain extent, an insulating medium film used for separating the gate electrode from the source and drain electrodes is likely to generate breakdown so as to cause short circuit of the source electrode and the gate electrode. Even if the insulating medium generates no breakdown, the accumulated static electricity shall cause voltage difference between the gate electrode and the source electrode to lead to TFT threshold voltage shift to change the TFT working property. Unless there is a proper discharge path, otherwise when the electro-static charges are randomly discharged after being accumulated to a certain degree, a part of the pixel structures may be broken to cause poor display or even damage of the whole liquid crystal display.

A lot of researches have been made to prevent electro-static damage in the TFT-LCD industry. Now a consensus has been basically formed that electro-static damage is associated with production equipment. Electro-static damage often occurs in the transport and disposal processes of glass substrates and in the manufacturing process of the TFT-LCD, for example, the electro-static discharges are likely to occur on the glass substrates in a thin film deposition process or a thin film etch process or any other process. With the increase of requirements on the production level and production efficiency of the TFT-LCD, the size of the glass substrate of the TFT-LCD becomes larger and larger, and the transportation and disposal speeds of the glass substrate are faster and faster. These changes have increased the risk of electro-static discharge damage. With the increase of the requirements on large-size LCD TVs, the sizes of the TFT-LCD devices are gradually decreased, for example, the width of a metal line is decreased to reduce parasitic capacitance. These changes on the structures of the thin film transistor devices result in easier electro-static discharge damage in the TFT-LCD manufacturing process.

Therefore, how to effectively improve the antistatic ability of the panel on the condition of not affecting the effective display region is a technical problem to be urgently solved by those skilled in the art.

BRIEF SUMMARY OF THE INVENTION

One inventive aspect is an electro-static discharge protection circuit for a liquid crystal display, where the liquid crystal display includes a signal line, a low level signal line and a high level signal line. The electro-static discharge protection circuit includes a first thin film transistor, where a drain/source electrode and a source/drain electrode of the first thin film transistor are respectively connected to the signal line and to the low level signal line. The electro-static discharge protection circuit also includes a second thin film transistor, where a drain/source electrode and a source/drain electrode of the second thin film transistor are respectively connected to the signal line and to the high level signal line. The electro-static discharge protection circuit also includes a third thin film transistor, where a drain/source electrode and a source/drain electrode of the third thin film transistor are respectively connected to the signal line and to the low level signal line, and a high level signal is provided to a gate electrode of the third thin film transistor. The electro-static discharge protection circuit also includes a fourth thin film transistor, where a drain/source electrode and a source/drain electrode of the fourth thin film transistor are respectively connected to the signal line and to the high level signal line, and a low level signal is provided to a gate electrode of the fourth thin film transistor. In response to positive electro-static charges being generated on the signal line, a thin film transistor with a gate electrode connected to the high level signal line is switched on, and the positive electro-static charges are discharged through the switched on thin film transistor. The voltage corresponding to the positive electro-static charges is higher than a voltage of the high level signal line. In response to negative electro-static charges being generated on the signal line, a thin film transistor with a gate electrode connected to the low level signal line is switched on, and the negative electro-static charges are discharged through the switched on thin film transistor. The voltage corresponding to the negative electro-static charges is lower than a voltage of the low level signal line.

DETAILED DESCRIPTION OF THE PREFERRED EMBODIMENTS

Although more detailed description on the invention is made below with reference to the drawings, and preferred embodiments of the invention are included therein, it should be understood that those skilled in the art may make modifications on the basis of the description and the modifications may still achieve the beneficial effects of the invention. Therefore, the following description should be understood as the extension of the concept of those skilled in the art, and not as a limitation of the invention.

In order to clearly describe all characteristics of practical embodiments, the known functions and structures are not described in detail below, because they will bring confusion to the invention due to unnecessary details. It should be understand that a lot of implementation details should be executed to achieve special targets of developers in the development of any actual embodiment, for example, one embodiment is changed into another embodiment according to the limitation of related systems or related business. In addition, it should be understand that the development work may be complicated and time-consuming, but is just routine work for those skilled in the art.

More detailed description on the invention is made in the following paragraphs with reference to the drawings by way of examples. The key points and the characteristics of the invention are clearer according to the following description. It should be noted that the drawings are shown in a very simplified form, use non-precise ratios, and are used for assisting in convenient and clear illustration of the embodiments of the invention.

Figure 1:
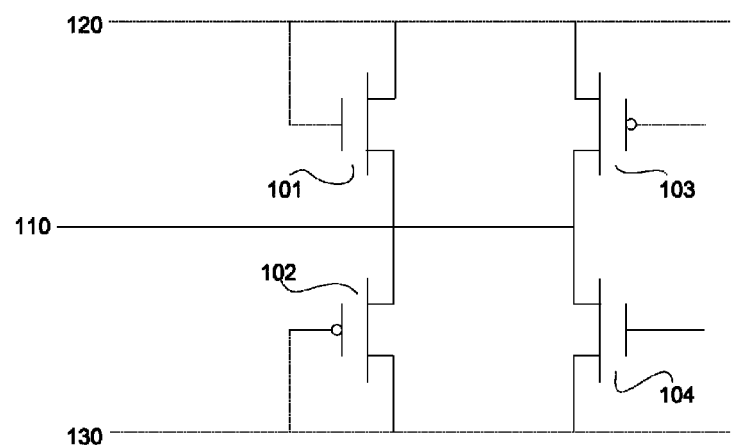
FIG. 1 is a schematic diagram of an electro-static discharge protection circuit in an embodiment of the invention.

An embodiment of the invention provides an electro-static discharge protection circuit, as shown in FIG. 1. FIG. 1 is a schematic diagram of an electro-static discharge protection circuit in the embodiment of the invention. A first thin film transistor 101, a second thin film transistor 102, a third thin film transistor 103 and a fourth thin film transistor 104 are arranged at an end of a signal line 110, wherein the first thin film transistor 101 is an N type thin film transistor, the source electrode and the drain electrode of the first thin film transistor are respectively connected with the signal line 110 and a low level signal line 120, and the gate electrode of the first thin film transistor is connected with the low level signal line 120; the second thin film transistor 102 is a P type thin film transistor, the source electrode and the drain electrode of the second thin film transistor are respectively connected with the signal line 110 and a high level signal line 130, and the gate electrode of the second thin film transistor is connected with the high level signal line 130; the third thin film transistor 103 is a P type thin film transistor, the source electrode and the drain electrode of the third thin film transistor are respectively connected with the signal line 110 and the low level signal line 120, and the gate electrode of the third thin film transistor is connected with the high level signal line 130 (not shown in FIG. 1); the fourth thin film transistor 104 is an N type thin film transistor, the source electrode and the drain electrode of the fourth thin film transistor are respectively connected with the signal line 110 and the high level signal line 130, and the gate electrode of the fourth thin film transistor is connected with the low level signal line 120 (not shown in FIG. 1). It should be noted that the definition of the source electrode and the drain electrode of a TFT switch differs in current flow, and herein the electrode connected with the signal line 110 is referred to as the source electrode and the electrode connected with the high level signal line 130 or the low level signal line 120 is referred to as the drain electrode, but this is not a limitation of the invention, the electrode connected with the signal line 110 being referred to as the drain electrode and the electrode connected with the high level signal line 130 or the low level signal line 120 being referred to as the source electrode also come into the protection scope of the invention. When positive electro-static charges are generated on the signal line 110, the voltage corresponding to the positive electro-static charges on the signal line 110 is higher than the voltage of the high level signal line 130, the second thin film transistor 102 and the third thin film transistor 103 with gate electrodes connected to the high level signal line 130 are switched on, and the positive electro-static charges are discharged through the switched on second thin film transistor 102 and the switched on third thin film transistor 103; when negative electro-static charges are generated on the signal line 110, the voltage corresponding to the negative electro-static charges on the signal line 110 is lower than the voltage of the low level signal line 120, the first thin film transistor 101 and the fourth thin film transistor 104 with gate electrodes connected to the low level signal line 120 are switched on, and the negative electro-static charges are discharged through the switched on first thin film transistor 101 and the switched on fourth thin film transistor 104.

It should be noted that the signal line 110 in the electro-static discharge protection circuit in the embodiment of the invention is a data line in a liquid crystal display panel, or the signal line 110 is a scanning line in the liquid crystal display panel.

With the electro-static discharge protection circuit in the embodiment of the invention, positive electro-static charges or negative electro-static charges generated on the signal line 110 are discharged to the high level signal line 130 and the low level signal line 120 through two switched on thin film transistors connecting with the high level signal line 130 and the low level signal line 120, so that the discharge path is perfected, the discharge speed may be accelerated and the antistatic ability of the panel is effectively improved.

Figure 2:
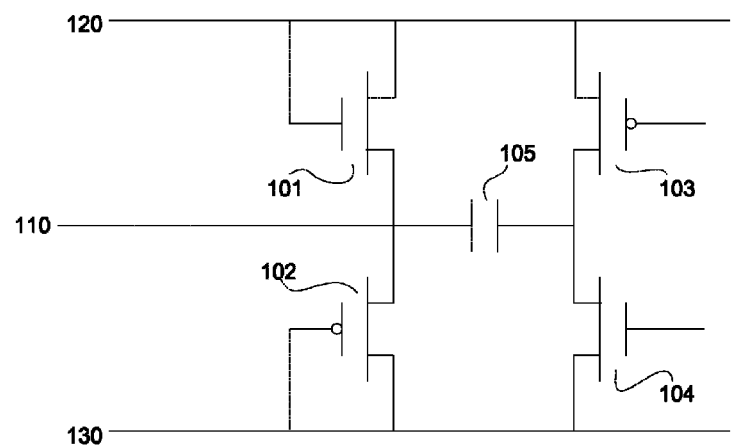
FIG. 2 is a schematic diagram of another electro-static discharge protection circuit in the embodiment of the invention.

Preferably, as shown in FIG. 2, which is a schematic diagram of another electro-static discharge protection circuit in the embodiment of the invention, a capacitor 105 is further arranged on the end of the signal line 110, the capacitor 105 is arranged between the first and second thin film transistors 101, 102 and the third and fourth thin film transistors 103, 104. The capacitor 105 may effectively reduce the leakage current flowing from the third thin film transistor 103 and the fourth thin film transistor 104 to the signal line so as to prevent reverse breakdown of the TFT devices in the electro-static discharge protection circuit and improve the display quality of the panel.

Figure 3:
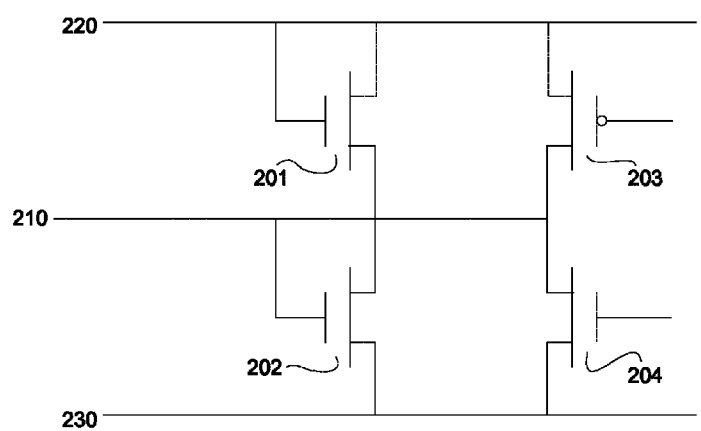
FIG. 3 is a schematic diagram of an electro-static discharge protection circuit in another embodiment of the invention.

Another embodiment of the invention provides an electro-static discharge protection circuit, as shown in FIG. 3. FIG. 3 is a schematic diagram of an electro-static discharge protection circuit in the embodiment of the invention. A first thin film transistor 201, a second thin film transistor 202, a third thin film transistor 203 and a fourth thin film transistor 204 are arranged at an end of a signal line 210, wherein the first thin film transistor 201 is an N type thin film transistor, the source electrode and the drain electrode of the first thin film transistor are respectively connected with the signal line 210 and a low level signal line 220, and the gate electrode of the first thin film transistor is connected with the low level signal line 220; the second thin film transistor 202 is an N type thin film transistor, the source electrode and the drain electrode of the second thin film transistor are respectively connected with the signal line 210 and a high level signal line 230, and the gate electrode of the second thin film transistor is connected with the signal line 210; the third thin film transistor 203 is a P type thin film transistor, the source electrode and the drain electrode of the third thin film transistor are respectively connected with the signal line 210 and the low level signal line 220, and the gate electrode of the third thin film transistor is connected with the high level signal line 230 (not shown in FIG. 3); the fourth thin film transistor 204 is an N type thin film transistor, the source electrode and the drain electrode of the fourth thin film transistor are respectively connected with the signal line 210 and the high level signal line 230, and the gate electrode of the fourth thin film transistor is connected with the low level signal line 220 (not shown in FIG. 3). It should be noted that the definition of the source electrode and the drain electrode of a TFT switch differs in current flow, and herein the electrode connected with the signal line 210 is referred to as the source electrode, and the electrode connected with the high level signal line 230 or the low level signal line 220 is referred to as the drain electrode. But this is not a limitation of the invention, the electrode connected with the signal line 210 being referred to as the drain electrode and the electrode connected with the high level signal line 230 or the low level signal line 220 being referred to as the source electrode also come into the protection scope of the invention. When positive electro-static charges are generated on the signal line 210, the voltage corresponding to the positive electro-static charges on the signal line 210 is higher than the voltage of the high level signal line 230, the second thin film transistor 202 with gate electrode connected to the signal line 210 and the third thin film transistor 203 with gate electrode connected to the high level signal line 230 are switched on, and the positive electro-static charges are discharged through the switched on second thin film transistor 202 and the switched on third thin film transistor 203; when negative electro-static charges are generated on the signal line 210, the voltage corresponding to the negative electro-static charges on the signal line 210 is lower than the voltage of the low level signal line 220, the first thin film transistor 201 and the fourth thin film transistor 204 with gate electrodes connected to the low level signal line 220 are switched on, and the negative electro-static charges are discharged through the switched on first thin film transistor 201 and the switched on fourth thin film transistor 204.

It should be noted that the signal line 210 in the electro-static discharge protection circuit in the embodiment of the invention is a data line in a liquid crystal display panel, or the signal line 210 is a scanning line in the liquid crystal display panel.

With the electro-static discharge protection circuit in the embodiment of the invention, positive electro-static charges or negative electro-static charges generated on the signal line 210 are discharged to the high level signal line 230 and the low level signal line 220 through two switched on thin film transistors connecting with the high level signal line 230 and the low level signal line 220, so that the discharge path is perfected, the discharge speed may be accelerated and the antistatic ability of the panel is effectively improved.

Figure 4:
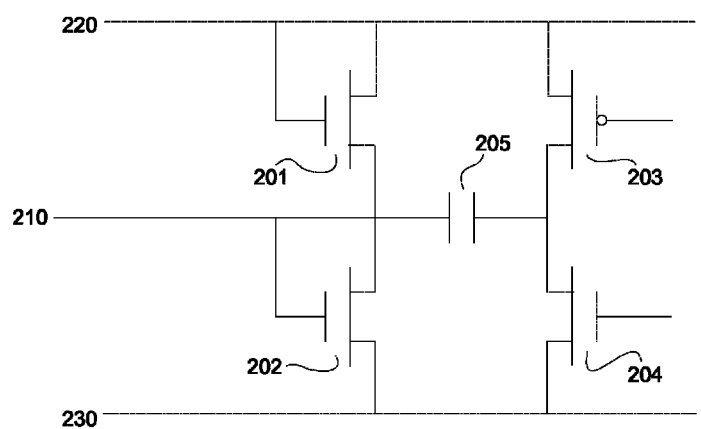
FIG. 4 is a schematic diagram of another electro-static discharge protection circuit in the another embodiment of the invention.

Preferably, as shown in FIG. 4, which is a schematic diagram of another electro-static discharge protection circuit in the embodiment of the invention, a capacitor 205 is further arranged on the end of the signal line 210, the capacitor 205 is arranged between the first and second thin film transistors 201, 202 and the third and fourth thin film transistors 203, 204. The capacitor 205 arranged on the end of the signal line 210 may effectively reduce the leakage current flowing from the third thin film transistor 203 and the fourth thin film transistor 204 to the signal line so as to prevent reverse breakdown of the TFT devices in the electro-static discharge protection circuit and improve the display quality of the panel.

Figure 5:
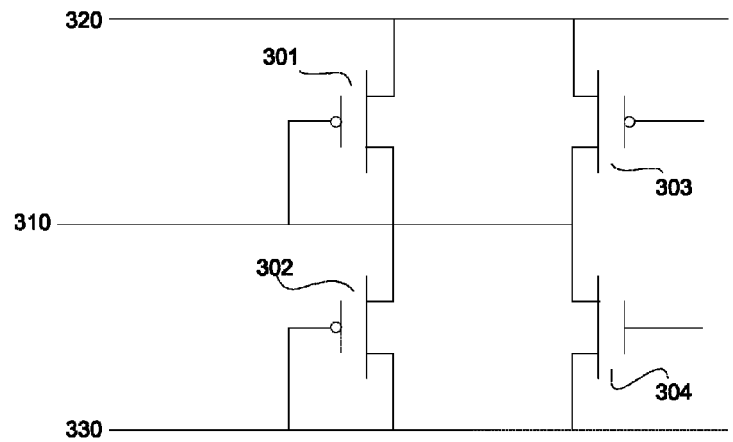
FIG. 5 is a schematic diagram of an electro-static discharge protection circuit in yet another embodiment of the invention.

Yet another embodiment of the invention provides an electro-static discharge protection circuit, as shown in FIG. 5. FIG. 5 is a schematic diagram of an electro-static discharge protection circuit in the embodiment of the invention. A first thin film transistor 301, a second thin film transistor 302, a third thin film transistor 303 and a fourth thin film transistor 304 are arranged at an end of a signal line 310, wherein the first thin film transistor 301 is a P type thin film transistor, the source electrode and the drain electrode of the first thin film transistor are respectively connected with the signal line 310 and a low level signal line 320, and the gate electrode of the first thin film transistor is connected with the signal line 310; the second thin film transistor 302 is a P type thin film transistor, the source electrode and the drain electrode of the second thin film transistor are respectively connected with the signal line 310 and a high level signal line 330, and the gate electrode of the second thin film transistor is connected with the high level signal line 330; the third thin film transistor 303 is a P type thin film transistor, the source electrode and the drain electrode of the third thin film transistor are respectively connected with the signal line 310 and the low level signal line 320, and the gate electrode of the third thin film transistor is connected with the high level signal line 330 (not shown in FIG. 5); the fourth thin film transistor 304 is an N type thin film transistor, the source electrode and the drain electrode of the fourth thin film transistor are respectively connected with the signal line 310 and the high level signal line 330, and the gate electrode of the fourth thin film transistor is connected with the low level signal line 320 (not shown in FIG. 5). It should be noted that the definition of the source electrode and the drain electrode of a TFT switch differs in current flow, and herein the electrode connected with the signal line 310 is referred to as the source electrode, and the electrode connected with the high level signal line 330 or the low level signal line 320 is referred to as the drain electrode. But this is not a limitation of the invention, the electrode connected with the signal line 310 being referred to as the drain electrode and the electrode connected with the high level signal line 330 or the low level signal line 320 being referred to as the source electrode also come into the protection scope of the invention. When positive electro-static charges are generated on the signal line 310, the voltage corresponding to the positive electro-static charges on the signal line 310 is higher than the voltage of the high level signal line 330, the second thin film transistor 302 and the third thin film transistor 303 with gate electrodes connected to the high level signal line 330 are switched on, and the positive electro-static charges are discharged through the switched on second thin film transistor 302 and the switched on third thin film transistor 303; when negative electro-static charges are generated on the signal line 310, the voltage corresponding to the negative electro-static charges on the signal line 310 is lower than the voltage of the low level signal line 320, the first thin film transistor 301 with gate electrode connected to the signal line 310 and the fourth thin film transistor 304 with gate electrode connected to the low level signal line 320 are switched on, and the negative electro-static charges are discharged through the switched on first thin film transistor 301 and the switched on fourth thin film transistor 304.

It should be noted that the signal line 310 in the electro-static discharge protection circuit in the embodiment of the invention is a data line in a liquid crystal display panel, or the signal line 310 is a scanning line in the liquid crystal display panel.

With the electro-static discharge protection circuit in the embodiment of the invention, positive electro-static charges or negative electro-static charges generated on the signal line 310 are discharged to the high level signal line 330 and the low level signal line 320 through two thin film transistors connecting with the high level signal line 330 and the low level signal line 320, so that the discharge path is perfected, the discharge speed may be accelerated and the antistatic ability of the panel is effectively improved.

Figure 6:
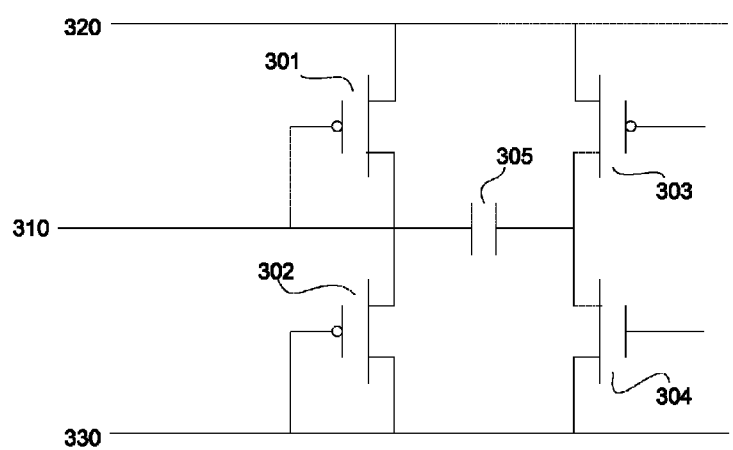
FIG. 6 is a schematic diagram of another electro-static discharge protection circuit in the yet another embodiment of the invention.

Preferably, as shown in FIG. 6, which is a schematic diagram of another electro-static discharge protection circuit in the embodiment of the invention, a capacitor 305 is further arranged on the end of the signal line 310, the capacitor 305 is arranged between the first and second thin film transistors 301, 302 and the third and fourth thin film transistors 303, 304. The capacitor 305 arranged on the end of the signal line 310 may effectively reduce the leakage current flowing from the third thin film transistor 303 and the fourth thin film transistor 304 to the signal line so as to prevent reverse breakdown of the TFT devices in the electro-static discharge protection circuit and improve the display quality of the panel.

Further, the invention provides a liquid crystal display, the liquid crystal display is provided with a signal line, a low level signal line, a high level signal line and the abovementioned electro-static discharge protection circuit.

In view of the above, although the invention has been disclosed above by the preferable embodiments, but they are not used for limiting the invention, various modifications and variations may be made by those skilled in the art without departing from the spirit and scope of the invention. Thus the invention is also intended to encompass these modifications and variations thereto so long as these modifications and variations come into the scope of the claims of the invention and their equivalents. The protection scope of the invention is subjected to the claims of the invention.

What is claimed is:

1. An electro-static discharge protection circuit for a liquid crystal display, wherein the liquid crystal display is provided with a signal line, a low level signal line and a high level signal line, and the electro-static discharge protection circuit comprises:
    a first thin film transistor, wherein a drain/source electrode and a source/drain electrode of the first thin film transistor are respectively connected to the signal line and the low level signal line;
    a second thin film transistor, wherein a drain/source electrode and a source/drain electrode of the second thin film transistor are respectively connected to the signal line and the high level signal line;
    a third thin film transistor, wherein a drain/source electrode and a source/drain electrode of the third thin film transistor are respectively connected to the signal line and the low level signal line, and a high level signal is provided to a gate electrode of the third thin film transistor; and
    a fourth thin film transistor, wherein a drain/source electrode and a source/drain electrode of the fourth thin film transistor are respectively connected to the signal line and the high level signal line, and a low level signal is provided to a gate electrode of the fourth thin film transistor, wherein when positive electro-static charges are generated on the signal line, a voltage corresponding to the positive electro-static charges is higher than a voltage of the high level signal line, a thin film transistor with a gate electrode connected to the high level signal line is switched on, and the positive electro-static charges are discharged through the switched on thin film transistor, and when negative electro-static charges are generated on the signal line, a voltage corresponding to the negative electro-static charges is lower than a voltage of the low level signal line, a thin film transistor with a gate electrode connected to the low level signal line is switched on, and the negative electro-static charges are discharged through the switched on thin film transistor.

2. The electro-static discharge protection circuit of claim 1, wherein the high level signal provided to the gate electrode of the third thin film transistor is provided by the high level signal line, and the low level signal provided to the gate electrode of the fourth thin film transistor is provided by the low level signal line.

3. The electro-static discharge protection circuit of claim 1, wherein a gate electrode of the first thin film transistor is connected to the low level signal line, and a gate electrode of the second thin film transistor is connected to the high level signal line.

4. The electro-static discharge protection circuit of claim 3, wherein the first thin film transistor is an N type thin film transistor, and the second thin film transistor is a P type thin film transistor.

5. The electro-static discharge protection circuit of claim 1, wherein a gate electrode of the first thin film transistor is connected to the signal line, and a gate electrode of the second thin film transistor is connected to the high level signal line.

6. The electro-static discharge protection circuit of claim 5, wherein the first thin film transistor is a P type thin film transistor, and the second thin film transistor is a P type thin film transistor.

7. The electro-static discharge protection circuit of claim 1, wherein a gate electrode of the first thin film transistor is connected to the low level signal line, and a gate electrode of the second thin film transistor is connected to the signal line.

8. The electro-static discharge protection circuit of claim 7, wherein the first thin film transistor is an N type thin film transistor, and the second thin film transistor is an N type thin film transistor.

9. The electro-static discharge protection circuit of claim 1, wherein the signal line is a data line or a scanning line.

10. The electro-static discharge protection circuit of claim 1, wherein a capacitor is arranged between the first and second thin film transistors and the third and fourth thin film transistors on the signal line.

11. A liquid crystal display, comprising an electro-static discharge protection circuit, wherein the liquid crystal display is provided with a signal line, a low level signal line and a high level signal line, and the electro-static discharge protection circuit comprises:
    a first thin film transistor, wherein a drain/source electrode and a source/drain electrode of the first thin film transistor are respectively connected to the signal line and the low level signal line;
    a second thin film transistor, wherein a drain/source electrode and a source/drain electrode of the second thin film transistor are respectively connected to the signal line and the high level signal line;

a third thin film transistor, wherein a drain/source electrode and a source/drain electrode of the third thin film transistor are respectively connected to the signal line and the low level signal line, and a high level signal is provided to a gate electrode of the third thin film transistor; and a fourth thin film transistor, wherein a drain/source electrode and a source/drain electrode of the fourth thin film transistor are respectively connected to the signal line and the high level signal line, and a low level signal is provided to a gate electrode of the fourth thin film transistor, wherein when positive electro-static charges are generated on the signal line, a voltage corresponding to the positive electro-static charges is higher than a voltage of the high level signal line, a thin film transistor with a gate electrode connected to the high level signal line is switched on, and the positive electro-static charges are discharged through the switched on thin film transistor, and when negative electro-static charges are generated on the signal line, a voltage corresponding to the negative electro-static charges is lower than a voltage of the low level signal line, a thin film transistor with a gate electrode connected to the low level signal line is switched on, and the negative electro-static charges are discharged through the switched on thin film transistor.

12. The liquid crystal display of claim 11, wherein the high level signal provided to the gate electrode of the third thin film transistor is provided by the high level signal line, and the low level signal provided to the gate electrode of the fourth thin film transistor is provided by the low level signal line.

13. The liquid crystal display of claim 11, wherein a gate electrode of the first thin film transistor is connected to the low level signal line, and a gate electrode of the second thin film transistor is connected to the high level signal line.

14. The liquid crystal display of claim 13, wherein the first thin film transistor is an N type thin film transistor, and the second thin film transistor is a P type thin film transistor.

15. The liquid crystal display of claim 11, wherein a gate electrode of the first thin film transistor is connected to the signal line, and a gate electrode of the second thin film transistor is connected to the high level signal line.

16. The liquid crystal display of claim 15, wherein the first thin film transistor is a P type thin film transistor, and the second thin film transistor is a P type thin film transistor.

17. The liquid crystal display of claim 11, wherein a gate electrode of the first thin film transistor is connected to the low level signal line, and a gate electrode of the second thin film transistor is connected to the signal line.

18. The liquid crystal display of claim 17, wherein the first thin film transistor is an N type thin film transistor, and the second thin film transistor is an N type thin film transistor.

19. The liquid crystal display of claim 11, wherein the signal line is a data line or a scanning line.

20. The liquid crystal display of claim 11, wherein a capacitor is arranged between the first and second thin film transistors and the third and fourth thin film transistors on the signal line.

* * * * *